United States Patent
Wang et al.

(10) Patent No.: US 11,527,491 B2
(45) Date of Patent: Dec. 13, 2022

(54) METHOD FOR FABRICATING SUBSTRATE STRUCTURE

(71) Applicant: Siliconware Precision Industries Co., Ltd., Taichung (TW)

(72) Inventors: Po-Hao Wang, Taichung (TW); Chun-Tang Lin, Taichung (TW); Shou-Qi Chang, Taichung (TW); Yu-Hsiang Hsieh, Taichung (TW)

(73) Assignee: Siliconware Precision Industries Co., Ltd, Taichung (TW)

( * ) Notice: Subject to any disclaimer, the term of this patent is extended or adjusted under 35 U.S.C. 154(b) by 0 days.

(21) Appl. No.: 17/337,770

(22) Filed: Jun. 3, 2021

(65) Prior Publication Data

US 2021/0296261 A1 Sep. 23, 2021

Related U.S. Application Data

(62) Division of application No. 15/624,590, filed on Jun. 15, 2017, now Pat. No. 11,056,442.

(30) Foreign Application Priority Data

Mar. 3, 2017 (TW) .................................. 106106979

(51) Int. Cl.
*H01L 23/00* (2006.01)
*H01L 23/14* (2006.01)
(Continued)

(52) U.S. Cl.
CPC ............ *H01L 23/562* (2013.01); *H01L 23/13* (2013.01); *H01L 23/147* (2013.01); *H01L 23/49827* (2013.01); *H01L 25/0657* (2013.01); *H01L 23/3121* (2013.01); *H01L 24/16* (2013.01); *H01L 24/32* (2013.01); *H01L 24/73* (2013.01); *H01L 24/97* (2013.01); *H01L 2224/13101* (2013.01); *H01L 2224/16225* (2013.01);
(Continued)

(58) Field of Classification Search
CPC ............... H01L 23/3121; H01L 21/563; H01L 29/0657; H01L 2221/6834; H01L 2224/0554; H01L 2224/0557; H01L 2224/05571; H01L 2224/05573; H01L 2224/16225; H01L 2224/32225; H01L 2224/73203; H01L 2224/73204; H01L 2924/00014; H01L 2924/01079; H01L 2924/10155; H01L 2924/10157; H01L 2924/1815
See application file for complete search history.

(56) References Cited

U.S. PATENT DOCUMENTS 7,795,585 B2 * 9/2010 Sogawa ............ H01L 27/14618
250/340
2005/0062135 A1 3/2005 Tase et al.
(Continued)

*Primary Examiner* — Ahmed N Sefer
(74) *Attorney, Agent, or Firm* — Hsuanyeh Law Group P.C

(57) ABSTRACT

A substrate structure has an obtuse portion formed between a side surface and a bottom surface of a substrate body. The obtuse portion includes a plurality of turning surfaces to disperse the stress of the substrate body generated in the packaging process. Therefore, the substrate body is prevented from being cracked. A method for fabricating the substrate structure and an electronic package including the substrate structure are also provided.

7 Claims, 5 Drawing Sheets

(51) Int. Cl.
*H01L 25/065* (2006.01)
*H01L 23/498* (2006.01)
*H01L 23/13* (2006.01)
*H01L 23/31* (2006.01)

(52) U.S. Cl.
CPC .............. *H01L 2224/32225* (2013.01); *H01L 2224/73204* (2013.01); *H01L 2924/15159* (2013.01); *H01L 2924/15311* (2013.01); *H01L 2924/181* (2013.01); *H01L 2924/18161* (2013.01); *H01L 2924/3512* (2013.01)

(56) References Cited

U.S. PATENT DOCUMENTS

| | | |
|---|---|---|
| 2008/0203420 A1 | 8/2008 | Higaki et al. |
| 2009/0023364 A1 | 1/2009 | Kuo |
| 2010/0181681 A1 | 7/2010 | Akiba et al. |
| 2010/0187556 A1 | 7/2010 | Kim et al. |
| 2010/0200888 A1 | 8/2010 | Kuhmann et al. |
| 2012/0186861 A1* | 7/2012 | Shimizu .................. H01L 24/19 174/258 |
| 2012/0213944 A1 | 8/2012 | Yamauchi et al. |
| 2015/0107879 A1* | 4/2015 | Hasegawa ................ H05K 1/14 174/255 |
| 2015/0319846 A1 | 11/2015 | Kubo et al. |
| 2017/0311445 A1 | 10/2017 | Chang et al. |
| 2018/0166328 A1* | 6/2018 | Tang .................... H01L 21/304 |

\* cited by examiner

METHOD FOR FABRICATING SUBSTRATE STRUCTURE

CROSS-REFERENCE TO RELATED APPLICATION(S)

This application is a divisional of copending application U.S. Ser. No. 15/624,590, filed on Jun. 15, 2017, which claims under 35 U.S.C. § 119(a) the benefit of Taiwanese Application No. 106106979, filed on Mar. 3, 2017, the entire contents of which are incorporated herein by reference.

BACKGROUND

1. Technical Field

The disclosure relates to semiconductor packages, and, more particularly, to a substrate structure, an electronic package having the substrate structure, and a method for fabricating the substrate structure.

2. Description of Related Art

There are numerous techniques used in chip packaging, including flip chip modules, such as Chip Scale Package (CSP), Direct Chip Attached (DCA) or Multi-Chip Module (MCM), or 3D IC chip stacked modules that stack chips in a three-dimensional manner, wherein packaging structure areas are reduced and signal transmission paths are shortened by flip chip package fabrication processes.

In flip chip package fabrication processes, since the thermal expansion coefficients of a chip and a package substrate are quite different from each other, bumps on the outer periphery of the chip cannot form good bonding with corresponding contacts on the package substrate, and may be peeled off from the circuit substrate. As the degree of integration of integrated circuits increases, mismatch in thermal expansion coefficients between the chip and the package substrate, as well as the thermal stress and warpage resulting from the mismatch, become more severe. As a result, reliability in electrical connections between the chip and the package substrate reduces, leading to failures in reliability tests.

In order to address the above problem, an interposer made of a semiconductor substrate disposed between the chip and the package substrate has been proposed. By using a semiconductor substrate made of a material similar to the material of the chip, mismatch in thermal expansion coefficients between the chip and the package substrate can be eliminated.

As shown in FIG. 1, a semiconductor chip 13 is provided on a Through Silicon Interposer (TSI) 12 via a plurality of solder bumps 130. The TSI 12 has a plurality of Through Silicon Vias (TSVs) 120, and a redistribution layer (RDL) 121 electrically connecting the TSVs 120 and the solder bumps 130. The TSI 12 is bonded onto a package substrate 11 via the TSVs 120 and a plurality of conductive elements 110. The conductive elements 110 and the solder bumps 130 are then encapsulated with an underfill 10', and the semiconductor chip 13 and the TSI 12 are encapsulated by an encapsulant 10.

However, in the traditional packaging process of the semiconductor package 1, when temperature cycle or stress variation is encountered during transportation, passing through reflow oven, or drop tests, for example, a large corner stress may be created at some regions (e.g., the corners) of the semiconductor chip 13 and the TSI 12, causing cracks (such as cracks K in the diagram) to appear around the corners of the semiconductor chip 13 and the TSI 12, resulting in damage of the TSI 12 or the semiconductor chip 13, poor electrical connections between the TSI 12 and the semiconductor chip 13, failure in reliability tests, and eventually a poor product yield.

Moreover, the space between the semiconductor chip 13 and the TSI 12 for the underfill 10' becomes smaller, so the stress experienced at the edges of the semiconductor chip 13 is smaller, whereas the space between the TSI 12 and the package substrate 11 for the underfill 10' is larger, so the stress experienced at the edges of the TSI 12 is larger. Therefore, cracks (crack K shown) are more likely to occur at right-angle corners of the TSI 12, resulting in poor product reliability.

Therefore, there is an urgent need to find a solution that overcomes the aforementioned problems in the prior art.

SUMMARY

In view of the foregoing shortcomings in the prior art, the disclosure provides a substrate structure, which may include: a substrate body including a first surface, a second surface opposite to the first surface, a side surface adjoining the second surface, and an obtuse portion including a plurality of turning surfaces and formed between the side surface and the first surface; and a plurality of conductive bodies bonded to the substrate body.

The disclosure further provides a method for fabricating a substrate structure, which may include: providing a substrate module including a plurality of substrate bodies; forming a first concave portion between any adjacent two of the substrate bodies; forming at least one second concave portion in the first concave portion, the second concave portion having a maximum width less than a maximum width of the first concave portion; and cutting the substrate module along the second concave portion to separate the plurality of substrate bodies, wherein each of the separated substrate bodies includes a first surface, a second surface opposite to the first surface, a side surface adjoining the second surface, and an obtuse portion formed between the side surface and the first surface and including a plurality of turning surfaces formed by a wall of the first concave portion and a wall of the second concave portion.

In an embodiment, a plurality of the second concave portions are formed in the first concave portion, and the maximum widths of the second concave portions are reduced according to the order in which they are fabricated.

In an embodiment, the method further includes forming an encapsulating material on the substrate bodies.

In an embodiment, the substrate body is made of a semiconductor material.

In an embodiment, the obtuse portion is provided at a corner of the substrate body.

In an embodiment, the obtuse portion extends along an edge of the first surface.

In an embodiment, the turning surfaces are disposed adjacent to one another.

In an embodiment, the obtuse portion includes two or three of the turning surfaces.

In an embodiment, one of the turning surfaces adjoins the side surface or the first surface.

In an embodiment, the second surface and the side surface adjoin vertically.

In an embodiment, one of the conductive bodies is a circuit layer, a conductive pillar, a conductive bump or a combination thereof.

The disclosure further provides an electronic package, which may include: a carrier; at least one of the above substrate structure disposed on the carrier and electrically connected with the carrier through the conductive bodies; and an encapsulating material formed on the carrier. The encapsulating material includes an underfill formed between the carrier and the substrate structure and/or an encapsulant formed on the carrier and encapsulating the substrate structure.

In summary, the substrate structure, the electronic package having the substrate structure, and the method for fabricating the substrate structure in accordance with the disclosure disperse the stress experienced by the substrate body by forming the obtuse portion including the plurality of turning surfaces between the side surface and the first surface of the substrate body. Compared to the prior art, the disclosure eliminates the occurrences of cracks in the substrate body during the packaging process, thereby increasing the product yield.

DETAILED DESCRIPTION OF THE EMBODIMENTS

Figure 1:
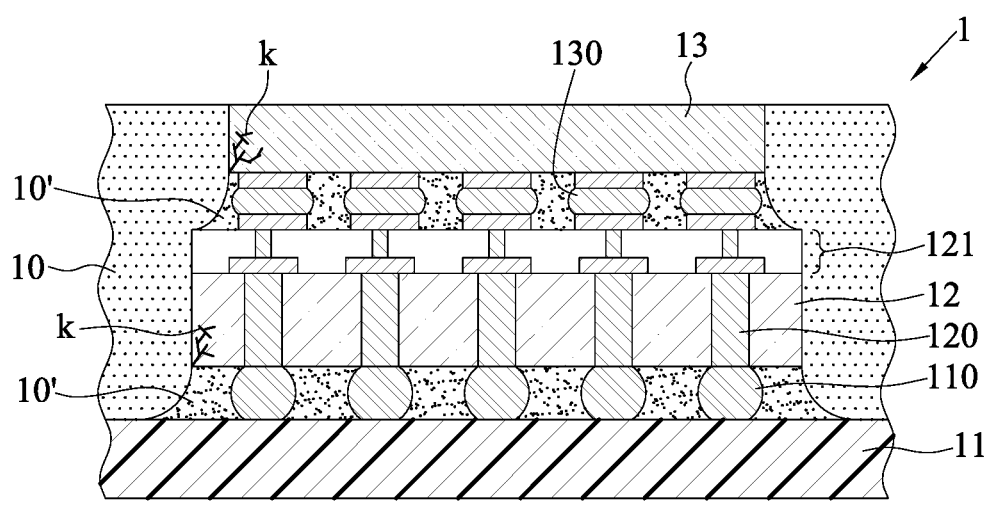
FIG. 1 is a schematic cross-sectional view of a conventional semiconductor package.

The disclosure is described by the following specific embodiments. Those with ordinary skills in the arts can readily understand other advantages and functions of the disclosure after reading the disclosure of this specification. The disclosure may also be practiced or applied with other different implementations. Based on different contexts and applications, the various details in this specification can be modified and changed without departing from the spirit of the disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the disclosure, and therefore have no substantial technical meaning. Without affecting the effects created and objectives achieved by the disclosure, any modifications, changes or adjustments to the structures, ratio relationships or sizes, are to be construed as fall within the range covered by the technical contents disclosed herein. Meanwhile, terms, such as "above", "first", "second", "third", "a", "one" and the like, are for illustrative purposes only, and are not meant to limit the range implementable by the disclosure. Any changes or adjustments made to their relative relationships, without modifying the substantial technical contents, are also to be construed as within the range implementable by the disclosure.

Figure 2A:
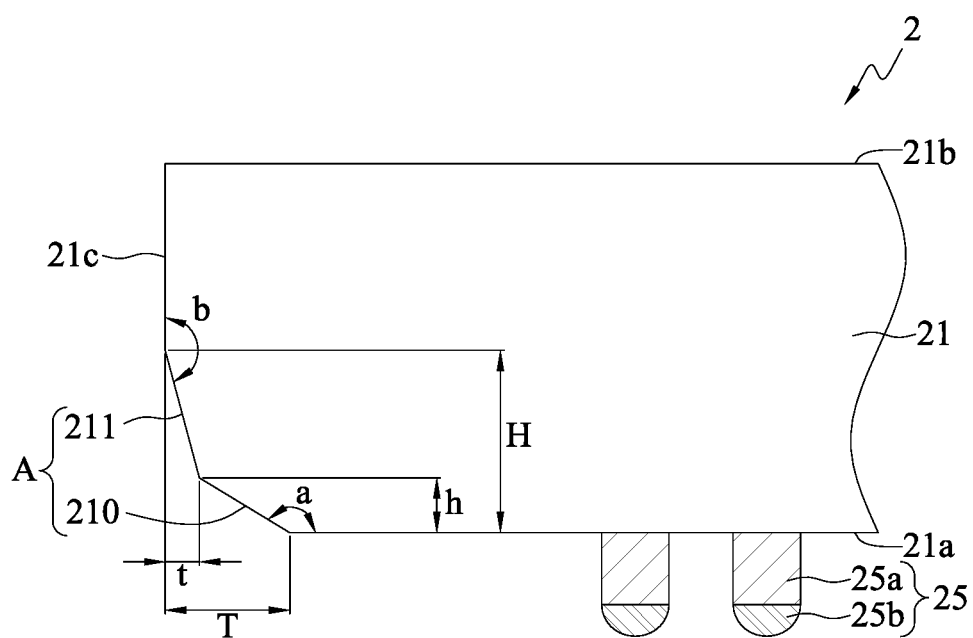
FIG. 2A is a schematic partial cross-sectional view of a substrate structure in accordance with the disclosure.
Figure 2B:
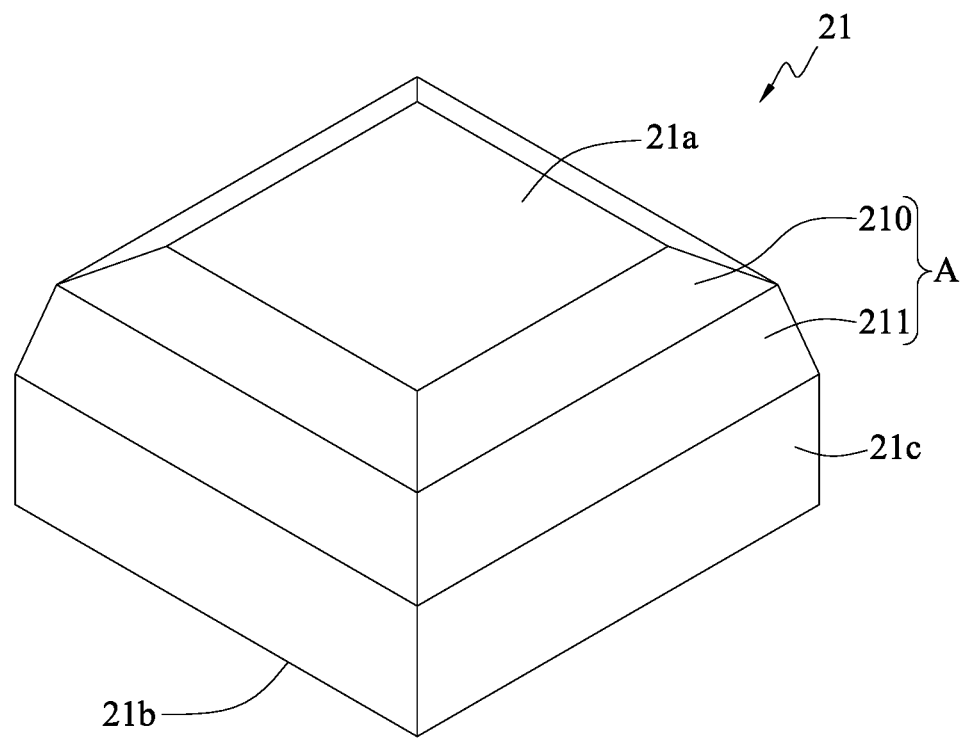
FIG. 2B is a partial isometric view of FIG. 2A.

FIGS. 2A and 2B are schematic cross-sectional views of a substrate structure 2 in accordance with the disclosure. As shown in FIG. 2A, the substrate structure 2 includes: a substrate body 21, and a plurality of conductive bodies 25 bonded to the substrate body 21.

The substrate body 21 can be a semiconductor material, and includes a first surface 21a, a second surface 21b opposite to the first surface 21a, and a side surface 21c adjoining the second surface 21b. The second surface 21b and the side surface 21c are joined to each other at a right angle, and an obtuse portion A is formed between the side surface 21c and the first surface 21a. In an embodiment, the obtuse portion A is defined with a plurality of (e.g., two) turning surfaces 210 and 211.

In an embodiment, the substrate body 21 is, but not limited to, a silicon chip or a Through-Silicon Interposer (TSI), and the substrate body 21 is, but not limited to, in the form of a strip or singulated.

Furthermore, the substrate body 21 can be a board in any geometric shape, such as rectangle (shown in FIG. 2B), polygon, circle or etc., and can be a symmetrical or non-symmetrical board, such that the substrate body 21 may assume a variety of different appearances, and the disclosure is not limited to these.

Moreover, the obtuse portion A adjoins the first surface 21a, without adjoining the second surface 21b, and the turning surfaces 210 and 211 are planar oblique faces. The turning surface 211 adjoins the side surface 21c, and the turning surface 210 adjoins the first surface 21a. As shown in FIG. 2A, the turning surface 210 adjoins an edge of the first surface 21a and extends to form another turning surface 211, such that these turning surfaces 210 and 211 are not parallel with the first surface 21a and the side surface 21c, and the angles of the turning surfaces to adjacent surfaces are all obtuse angles. In an embodiment, the angle between the turning surface 210 and the first surface 21a is 150°, and the angle between the turning surface 211 and the side surface 21c is 153°. It can be appreciated that the turning surface 210 can be almost at a right angle to the first surface 21a (i.e., the turning surface 210 is almost parallel to the side surface 21c), and the other turning surface 211 is almost horizontally connected thereto (i.e., the turning surface 211 is almost parallel to the first surface 21a), thus forming a breach on the obtuse portion A.

Figure 2C:
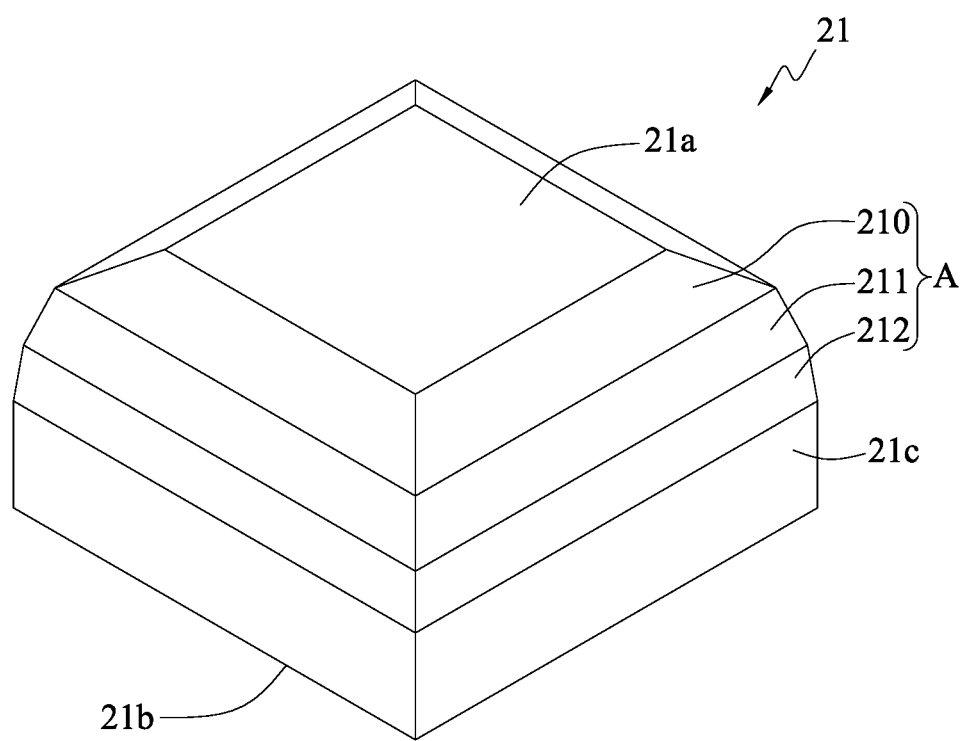
FIG. 2C is another implementation of FIG. 2B.

The range of the obtuse portion A can be selected according to needs. The ranges of the turning surfaces 210 and 211 can also be selected according to needs. In an embodiment, the total height H of the turning surfaces 210 and 211 is 61.6 μm, the total width T of the turning surfaces 210 and 211 is 50.8 μm, the height h of the turning surface 210 is 16.1 μm, and the width t of the turning surface 211 is 22.5 μm. The number of turning surfaces are not limited to two, and the obtuse portion A may be defined with three turning surfaces, such as turning surfaces 210, 211, 212 shown in FIG. 2C, or four or more turning surfaces.

The conductive bodies 25 can be a circuit layer (not shown), inner conductive pillars (not shown), conductive bumps (such as those shown in FIG. 2), or a combination of the above.

In an embodiment, each of the conductive bodies 25 includes a metal pillar 25a and a solder material 25b provided on the metal pillar 25a.

Figure 3A:
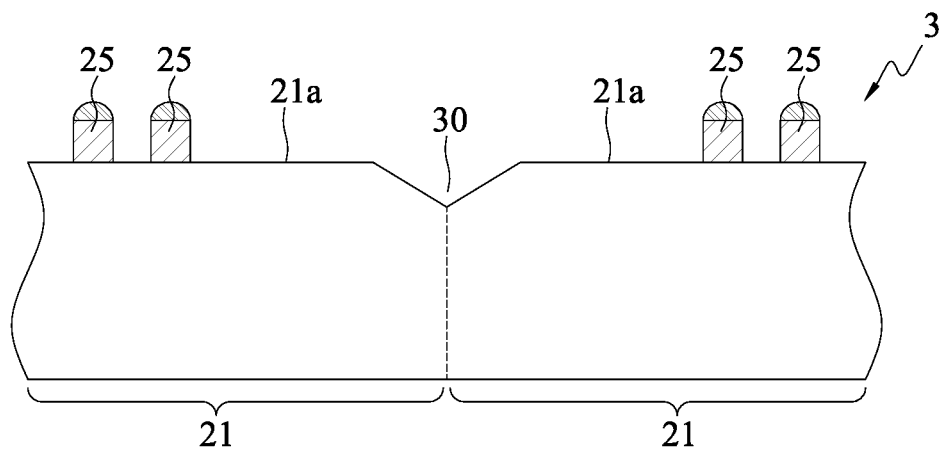
FIGS. 3A to 3C are schematic cross-sectional views illustrating a method for fabricating the substrate structure corresponding to FIG. 2A.
Figure 3B:
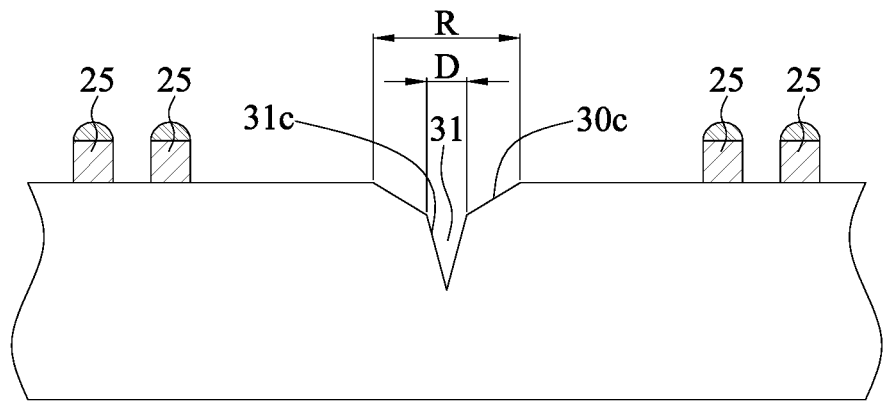
Figure 3C:
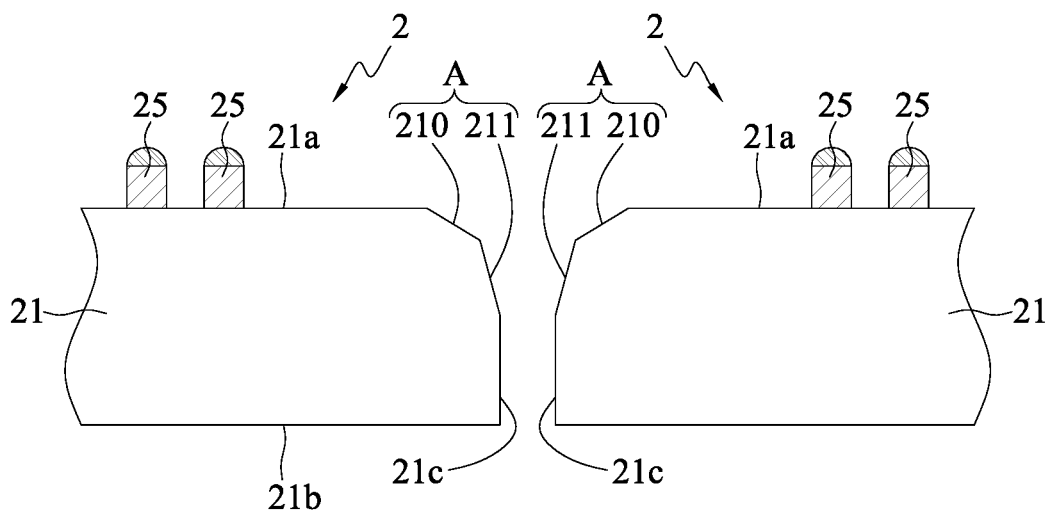

Referring to FIGS. 3A to 3C, schematic cross-sectional diagrams illustrating a method for fabricating the substrate structure 2 in accordance of the disclosure are shown.

As shown in FIG. 3A, a substrate module 3 including a plurality of substrate bodies 21 is provided, and a plurality of conductive bodies 25 can be selectively bonded to the substrate bodies 21. At least one first concave portion 30 is formed on the first surfaces 21a of the substrate bodies 21.

The substrate bodies 21 are arranged in an array, and the first concave portion 30 is formed between any two of the substrate bodies 21.

In an embodiment, the substrate module 3 is, but not limited to, a silicon wafer (including or not including the conductive bodies 25), or a package structure without singulation (such as a package structure including an underfill 400, a first substrate 21 and a second substrate 42, which will be described later, and which may include or not include the conductive bodies 25).

As shown in FIG. 3B, at least one second concave portion 31 is formed in the first concave portion 30, the maximum width D of the second concave portion 31 is less than the maximum width R of the first concave portion 30, and a wall 30c of the first concave portion 30 and a wall 31c of the second concave portion 31 become the turning surfaces 210 and 211, respectively.

In an embodiment, there are various ways for making the first and second concave portions 30 and 31, including mechanical cutting, ultrasound polishing, chemical-mechanical polishing (CMP), laser, water jet cutter, isotropic/anisotropic etching, dry/wet etching, or a combination of the above processes. In the case of mechanical cutting, cutting tools with two or more angles can be used.

The first and second concave portions 30 and 31 can have a variety of different appearances, and are not limited to the triangular cross-sectional shapes shown in FIGS. 3A and 3B, but can be other geometric shapes (e.g., arc, polygon, circle etc.)

Moreover, if a plurality of second concave portions 31 are formed in the first concave portion 30, the maximum widths D of these second concave portions 31 decrease with the order in which they are fabricated, so as to form more turning surfaces.

Furthermore, the depths of the concave portions define the range of the obtuse portion A. It can be appreciated that the more concave portions that are formed (e.g., more cutters with different blade angles), the more the appearance of the obtuse portion A looks like an arc. More specifically, according to experiments, two or three turning surfaces meets practical demands, and can be achieved by cutting tools.

As shown in FIG. 3C, the substrate module 3 is cut using the second concave portion 31 as the cutting path, thereby separating the substrate bodies 21 and forming a plurality of substrate structure 2.

Accordingly, in the substrate structure 2 according to the disclosure, the obtuse portion A is formed between the side surface 21c and the first surface 21a of the substrate body 21, such that the edges of the surface of the substrate body 21 are obtuse instead of acute, thus eliminating the issue of stress concentration due to right angles. Therefore, with the design of the turning surfaces 210 and 211 on the substrate structure 2 according to the disclosure, the stress created during subsequent packaging process can be dispersed, and stress concentrating around corners (or other places) of the substrate body 21 can be eliminated. As a result, the substrate structure 2 is less likely to have cracks after packaging, thereby increasing the product yield.

Figure 4:
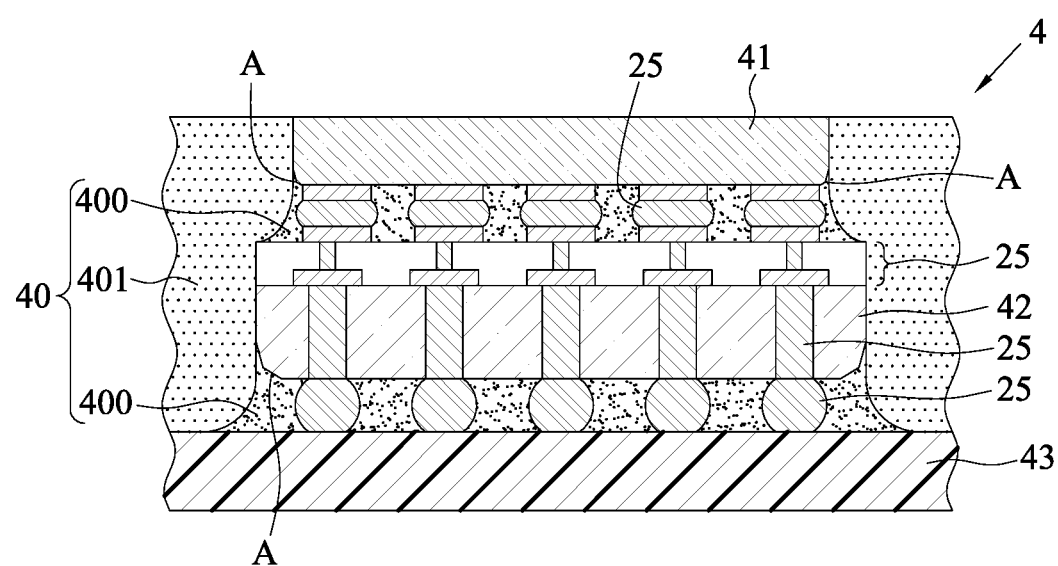
FIG. 4 is a schematic cross-sectional view of an electronic package in accordance with the disclosure.

FIG. 4 is a schematic cross-sectional view of an electronic package 4 in accordance with the disclosure. The electronic package 4 includes: a carrier 43, a substrate structure (e.g., a first substrate 41 and/or a second substrate 42) disposed on and electrically connected with the carrier 43, and an encapsulating material 40 for encapsulating the substrate structure.

The carrier 43 can be made of a metal, ceramic or organic material, and is used as a package substrate, and the first substrate 41 and the second substrate 42 are semiconductor materials. The second substrate 42 is used as a TSI and is placed directly on and electrically connected with the carrier 43, while the first substrate 41 is used as an electronic element and is bonded to and electrically connected with the second substrate 42.

In an embodiment, the carrier 43 is a substrate with a core layer and a circuit structure or a coreless circuit structure such as a fan-out redistribution layer (RDL). It can be appreciated that the carrier 43 can be used as, but not limited to, a carrier unit (e.g., a leadframe) for carrying other electronic elements (e.g., a chip).

In an embodiment, the first substrate 41 is an electronic element, such as an active element, a passive element or a combination of both. In another embodiment, the active element can be a semiconductor chip, and the passive element can be a resistor, a capacitor or an inductor.

In another implementation (not shown), the first substrate 41 (e.g., the electronic element) can be directly placed on the carrier 43, without the intermediate second substrate 62 (e.g., the TSI) disposed.

Moreover, the obtuse portion A including the plurality of turning surfaces 210 and 211 can be optionally formed on the first substrate 41 and/or the second substrate 42. It can be appreciated that the size of the first substrate 41 is very small, such that the appearance of the obtuse portion A formed thereon approximates an arc shape.

The conductive bodies 25 are bonded to the first substrate 41 and the second substrate 42 for electrically connecting the first substrate 41, the second substrate 42 and the carrier 43.

The encapsulating material 40 is formed on the carrier 43 to encapsulate the first substrate 41 and the second substrate 42.

In an embodiment, the encapsulating material 40 includes an underfill 400 and an encapsulant 401. The underfill 400 is formed between the first substrate 41 and the second substrate 42 and between the second substrate 42 and the carrier 43, and the encapsulant 401 is formed on the carrier 43 to encapsulate the underfill 400, the first substrate 41 and the second substrate 42.

Accordingly, the electronic package 4 according to the disclosure allows stress on the first substrate 41 and the second substrate 42 created during formation of the encapsulating material 40 to be dispersed through the design of the turning surfaces 210 and 211 (or the obtuse portion A), eliminating the issue of stress being concentrated at the corners of the first substrate 41 and the second substrate 42, and preventing cracks from occurring in the first substrate 41 and the second substrate 42 during the packaging process, thereby increasing the product yield.

Therefore, the turning surfaces 210 and 211 (or the obtuse portion A) disclosed can be located as required. For example, they can be located at places on the substrate body 21 where stress concentration is prone to occur during the fabrication processes of the substrate structure 2, thereby avoiding cracks to be formed on the substrate body 21. For example, the obtuse portion A is located at each of the corners of the substrate body 21, or even along the edges of the first surface 21a, such as that shown in FIG. 2B. More specifically, during the packaging process, corner stress is formed from stress being concentrated at the corners of the substrate body 21, causing large stress between the substrate body 21 and the encapsulating material 40, so these turning surfaces 210 and 211 can be disposed at the corners.

In summary, the substrate structure, the electronic package having the substrate structure, and the method for fabricating the substrate structure in accordance with the disclosure alleviate stress concentration and thus increases the product yield through the provision of the turning surfaces.

The above embodiments are only used to illustrate the principles of the disclosure, and should not be construed as to limit the disclosure in any way. The above embodiments can be modified by those with ordinary skill in the art without departing from the scope of the disclosure as defined in the following appended claims.

What is claimed is:

1. A method for fabricating a substrate structure, comprising:
   providing a substrate module including a plurality of substrate bodies and a plurality of conductive bodies bonded to the substrate bodies;
   forming a first concave portion between any adjacent two of the substrate bodies, wherein the first concave portion is formed on the substrate bodies and free from being formed on the conductive bodies;
   forming at least one second concave portion in the first concave portion, the second concave portion having a maximum width less than a maximum width of the first concave portion; and
   cutting the substrate module along the second concave portion to separate the plurality of substrate bodies, wherein each of the separated substrate bodies includes a first surface, a second surface opposite to the first surface, a side surface adjoining the second surface, and an obtuse portion formed between the side surface and the first surface and including a plurality of turning surfaces formed by a wall of the first concave portion and a wall of the second concave portion, and wherein the obtuse portion extends along an edge of the first surface, and one of the turning surfaces adjoins the side surface.

2. The method of claim 1, wherein one of the obtuse portions is provided at a corner of a corresponding one of the substrate bodies.

3. The method of claim 1, wherein one of the obtuse portions includes two or three of the turning surfaces.

4. The method of claim 1, wherein the turning surfaces are disposed adjacent to one another.

5. The method of claim 1, wherein the second surface and the side surface adjoin vertically.

6. The method of claim 1, wherein the first concave portion is formed with a plurality of the second concave portions therein, and the second concave portions have maximum widths reduced according to an order of a fabrication process thereof.

7. The method of claim 1, further comprising forming an encapsulating material on at least one of the substrate bodies.

* * * * *